United States Patent [19]

Buck

[11] 4,110,678
[45] Aug. 29, 1978

[54] ELECTRONIC MONITORING SYSTEM

[76] Inventor: Robert Buck, Kirchbühlweg 128, 7995 Neukirch, Fed. Rep. of Germany

[21] Appl. No.: 782,400

[22] Filed: Mar. 29, 1977

[30] Foreign Application Priority Data

Mar. 30, 1976 [DE] Fed. Rep. of Germany ....... 2613423

[51] Int. Cl.² .......................... G05F 1/56; H01H 36/00
[52] U.S. Cl. .............................. 323/22 SC; 307/252 J; 323/25; 340/562; 361/19
[58] Field of Search ............ 307/252 A, 252 J, 252 P; 323/19, 22 SC, 22 Z, 23, 25; 340/258 R, 258 B, 258 C, 282; 361/19

[56] References Cited

U.S. PATENT DOCUMENTS

| 3,679,961 | 7/1972 | Hamilton | 323/19 |
| 3,932,803 | 1/1976 | Buck | 323/19 |

*Primary Examiner*—Gerald Goldberg
*Attorney, Agent, or Firm*—Karl F. Ross

[57] ABSTRACT

A contactless motion detector, such as an oscillator sensitive to an approaching metallic element, is connected across a storage capacitor charged from a source of pulsating direct current through a current-limiting device and shunted by a Zener diode. Connected across the series combination of storage capacitor and current-limiting device is an ancillary thyristor, triggerable by the detector, forming part of a firing circuit for a main thyristor in parallel therewith; that firing circuit further includes another Zener diode and a stabilizing resistor in series with the ancillary thyristor. Conduction of the main thyristor, upon the triggering of the ancillary thyristor, reduces to near-zero the resistance in series with a load, such as a relay, which is traversed by the current drawn from the source. With both thyristors cut off between pulsations of the source current, the storage capacitor is briefly recharged through a decoupling diode upon a retriggering of the ancillary thyristor before the firing of the main thyristor.

7 Claims, 2 Drawing Figures

ELECTRONIC MONITORING SYSTEM

FIELD OF THE INVENTION

My present invention relates to an electronic monitoring system, as used for example in a proximity sensor, wherein a preferably contactless detector, sensitive to an ambient condition, generates an output signal which varies with a change in that condition, e.g. with the approach of a metallic element, to increase (or decrease) the current flow through a load designed to indicate such change.

BACKGROUND OF THE INVENTION

Such a monitoring system has been described in my prior U.S. Pat. Nos. 3,747,010, 3,747,011, 3,747,012, 3,919,661, 3,932,774, 3,932,803 and 3,935,542. As particularly disclosed in U.S. Pat. No. 3,932,803, the contactless motion detector may comprise an oscillator and an associated trigger amplifier whose energizing circuit includes a storage capacitor which is charged via a two-conductor supply network from a source of pulsating direct current by way of a constant-current device in parallel with the anode/cathode path of an output thyristor. In one embodiment of the system described and claimed in the latter patent, the output thyristor and the constant-current device lie in series with an ancillary thyristor which shunts the storage capacitor and is separated therefrom by a decoupling diode. When the output thyristor is triggered by a signal from the oscillator, the ancillary thyristor is fired through a Zener diode inserted between its anode and its gate; thus, the two series-connected thyristors conduct simultaneously in series with a load such as a relay whose operated (or unoperated) state indicates an abnormal condition, e.g. the fact that the oscillator has detected the approach of a metallic element.

Through the system just described operates generally satisfactorily, a drawback resides in the fact that the load is energized through a resistance representing the sum of the resistances of the two series-connected thyristors in their conductive state.

OBJECT OF THE INVENTION

The object of my present invention, therefore, is to provide an improved electronic switching system of the general type discussed above in which the resistance in series with the load is still further reduced in its high-current phase to increase the sensitivity of the system.

SUMMARY OF THE INVENTION

I realize this object, in accordance with my present invention, by the provision of a first electronic control device having a pair of main electrodes respectively tied to the leads of the supply network and further having an input electrode, or gate, connected to one of its main electrodes (i.e. its anode if that control device is a thyristor or similar binary electronic switch such as a triac) through an operating circuit which includes a second electronic control device with input connections to the detector for changing the conductivity of the first control device in response to variations in the output signal of that detector, thereby modifying the energization of the load. Thus, the current flow through the load in a state of high conductivity of the first control device is limited practically exclusively by the resistance of that one device (aside from the internal resistance of the current source which preferably, as in the systems of my prior patents, includes a full-wave rectifier).

The active component of the detector need not be an oscillator but could be an impedance bridge, a field plate or any of a variety of electromagnetic, photoelectric or other transducers responding to a predetermined change of an external condition to be monitored.

The storage capacitor insuring the continued energization of the detector, regardless of the state of conductivity of the electronic control devices, is connected across the leads of the supply network in series with a current-limiting device which may be a constant-current unit, as in my prior U.S. Pat. No. 3,932,803, or simply a high-ohmic resistor, as in my prior U.S. Pat. No. 3,935,542. In contrast to the teachings of these prior patents, in which the current-limiting device lies directly in parallel with the output thyristor and charges the storage capacitor through a decoupling diode, such a decoupling diode is inserted pursuant to my present improvement only between that thyristor (or other electronic switch constituting the aforementioned second control device) and the capacitor and is not traversed by the charging current passing through the current-limiting device. This thyristor, triggerable by the detector, now plays an ancillary role in firing the main thyristor (representing the first control device) whose conduction raises the load current to its maximum value. The operating circuit lying between the anode and the gate of the main thyristor advantageously includes an impedance, preferably an electronic breakdown device such as a Zener diode, delaying the firing of the main thyristor after the ancillary thyristor has been triggered. During this brief delay period, the conduction of the ancillary thyristor recharges the storage capacitor through the decoupling diode while the current-limiting device is practically short-circuited by that conduction.

According to another feature of my invention, a stabilizing resistor inserted between the gate and the cathode of the main thyristor lies in series with the aforedescribed operating circuit to limit the flow of gate current in that thyristor. The firing of the main thyristor virtually short-circuits the series combination of ancillary thyristor, Zener diode and stabilizing resistor so that the latter thyristor ceases to conduct. With pulsating or raw-rectified current supplied by the source, the main thyristor is also cut off at the end of each pulsation during which it has been rendered conductive; this results in a periodic recharging of the storage capacitor at the beginning of each new half-cycle (or full cycle in the case of half-wave rectification).

BRIEF DESCRIPTION OF THE DRAWING

The above and other features of my invention will now be described in detail with reference to the accompanying drawing in which.

SPECIFIC DESCRIPTION

Figure 1:
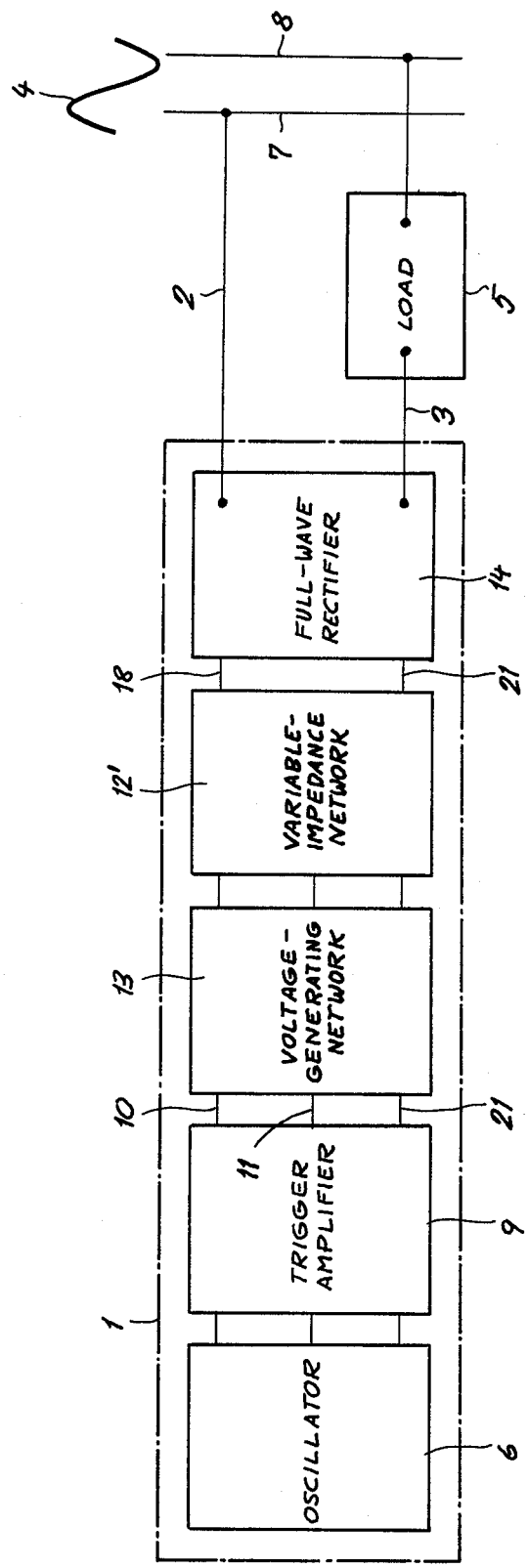
FIG. 1 is a block diagram of an electronic monitoring system according to my invention.

FIG. 1 shows the basic components of a monitoring system according to my invention, namely an oscillator 6 and a trigger amplifier 9 together constituting a detector, a current-responsive load 5 such as a relay in a supply circuit whose two conductors 2, 3 and a pair of leads 18, 21 extending to a variable-impedance network 12' whose impedance controls the load current in response to signals from oscillator 6, and a voltage-generating network 13 also receiving the output of rectifier 14 by way of leads 18 and 21. Network 13 is connected to amplifier 9 by leads 10, 11 and 21 which serve on the one hand to control a switching transistor 20 (FIG. 2) within that network and on the other hand to supply the detector stages 6 and 9 with operating voltage. Components 6, 9, 12', 13 and 14 form part of a proximity sensor 1 of the general type described in my prior U.S. patents, particularly U.S. Pat. No. 3,932,803 whose disclosure is hereby incorporated by reference into the present application.

Figure 2:
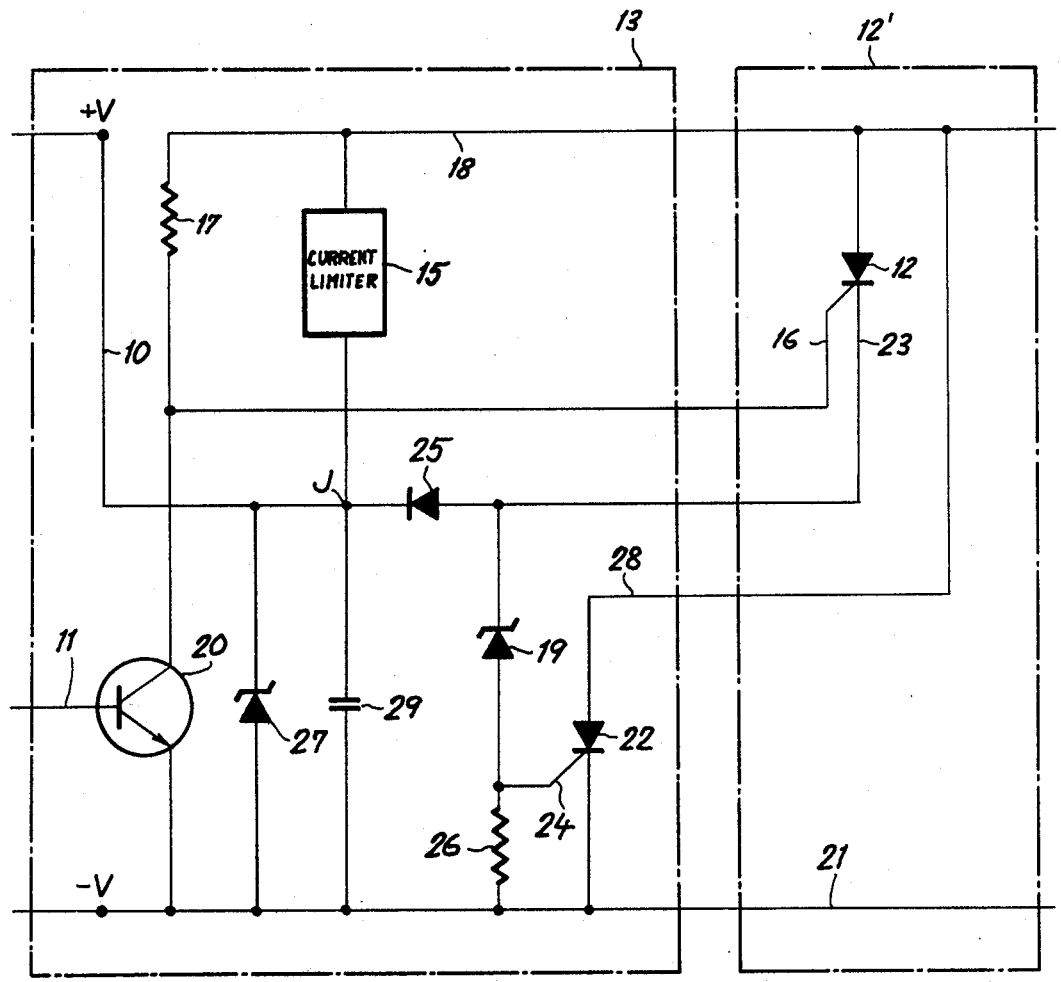
FIG. 2 is a more detailed circuit diagram of certain components of the system of FIG. 1, embodying the present improvement.

In FIG. 2 I have shown only the components 12' and 13 of the system of FIG. 1 since the others conform to the illustration of U.S. Pat. No. 3,932,803. Component 12' comprises an ancillary thyristor 12 with an anode tied to positive supply lead 18 carrying pulsating voltage $+V$, a gate connected to a lead 16 and a cathode provided with a lead 23. Component 13 includes the aforementioned switching transistor 20 of NPN type which, as in that prior patent, has its collector connected to gate lead 16 and also, through a resistor 17, to positive lead 18; its emitted is tied directly to negative supply lead 21 while its base is joined to lead 11 which is normally driven positive by oscillator 6 so that gate lead 16 is practically at voltage $-V$, maintaining the thyristor 12 in its non-conductive state.

A storage capacitor 29, inserted between leads 10 and 21, supplies operating current to components 6 and 9. Capacitor 29 lies in series with a current-limiting device 15, such as a constant-current unit of the type described in U.S. Pat. No. 3,932,803, connected to supply lead 18; a Zener diode 27 shunts this capacitor to limit its charging voltage. The junction J of current limiter 15 and capacitor 29 is connected through a decoupling diode 25 to the cathode lead 23 of thyristor 12.

In accordance with my present invention, a main thyristor 22 shunts the series combination of current limiter 15 and capacitor 29 by having its anode tied to lead 18 and its cathode joined to lead 21; a gate lead 24 of thyristor 22 is connected to lead 23 through another Zener diode 19 and to lead 21 through a stabilizing resistor 26.

As long as thyristor 12 is cut off, thyristor 22 also remains nonconductive. During each half-cycle of a-c source 4 (FIG. 1), enough current passes the device 15 to charge the capacitor 29 to the breakdown voltage of Zener diode 27 in order to keep oscillator 6 and amplifier 9 operating. When the oscillator detects the approach of a metallic element, lead 11 is driven negative and blocks the transistor 20 whereupon lead 16 goes positive and triggers the thyristor 12. The current now traversing this thyristor, passed by the diode 25, replenishes the charge of capacitor 29 at the beginning of the next half-cycle and, before Zener diode 27 conducts, breaks down the Zener diode 19 whose threshold is lower than that of diode 27. This action ignites the thyristor 22 which now short-circuits the remainder of the supply network shown in FIG. 2 and causes the flow of a large load current through the relay 5 (FIG. 1) which operates to indicate the response of detector 6, 9. Aside from rectifier 14 and the internal resistance of source 4, only the small resistance of the conductive thyristor 22 lies at this point in series with the load.

Relay 5 may be sufficiently slow-releasing to remain operated between current pulses when thyristors 12 and 22 are both cut off. If the detected off-normal condition persists, the thyristors are sequentially retriggered at the beginning of the next half-cycle with brief recharging of capacitor 29 through diode 25 just before the firing of thyristor 22.

I claim:

1. An electronic monitoring system comprising:
   detector means sensitive to an ambient condition for generating an output signal varying with a change in said condition, said detector means being provided with a pair of power-input terminals;
   a supply network including a storage capacitor connected across said power-input terminals, a pair of leads connected across a source of direct current in series with a load, and a current-limiting device connected across said leads in series with said storage capacitor;
   a first binary electronic three-electrode switch having a pair of main electrodes respectively connected directly to said leads and further having an input electrode; and
   an operating circuit for said first binary switch inserted between one main electrode and said input electrode thereof, said operating circuit including a second binary electronic three-electrode switch with input circuitry connected to said detector means for changing the conductivity of said first binary switch in response to variations in said output signal, thereby modifying the energization of said load, said operating circuit further including a Zener diode inserted in series with said second binary switch between one of said main electrodes and said input electrode of said first binary switch, said Zener diode becoming conductive upon a triggering of said second binary switch by said detector means to fire said first binary switch.

2. A system as defined in claim 1, further comprising a stabilizing resistor inserted between said input electrode and the other main electrode of said first binary switch in series with said operating circuit.

3. A system as defined in claim 2 wherein said binary switches are thyristors, said one of said main electrodes being an anode, said other main electrode being a cathode, said input electrode being a gate.

4. A system as defined in claim 1, further comprising a decoupling diode connecting said second binary switch in series with said storage capacitor for charging same prior to conduction of said first binary switch.

5. A system as defined in claim 4, further comprising a second Zener diode connected across said storage capacitor for limiting the charging voltage thereof.

6. A system as defined in claim 5 wherein said second Zener diode has a higher threshold voltage than said first Zener diode.

7. A system as defined in claim 1 wherein said source comprises an alternating-current supply and rectifier means in series therewith for delivering a pulsating direct current to said network whereby said first and second binary switches are cut off at the end of any pulsation during which they are rendered conductive.

* * * * *